(12) United States Patent
Kwak et al.

(10) Patent No.: US 7,279,708 B2
(45) Date of Patent: Oct. 9, 2007

(54) ELECTROLUMINESCENCE DISPLAY DEVICE AND METHOD OF MANUFACTURING THE SAME

(75) Inventors: Won-Kyu Kwak, Suwon-si (KR); Kwan-Hee Lee, Suwon-si (KR); Seung-Yong Song, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 114 days.

(21) Appl. No.: 11/138,323

(22) Filed: May 27, 2005

(65) Prior Publication Data

US 2006/0060850 A1    Mar. 23, 2006

(30) Foreign Application Priority Data

May 29, 2004    (KR) .................... 10-2004-0038735

(51) Int. Cl.
*H01L 29/04*    (2006.01)
*H01L 21/00*    (2006.01)

(52) U.S. Cl. ..................... 257/59; 257/66; 257/72; 438/48; 438/82; 438/149

(58) Field of Classification Search .......... 257/40, 257/59, 66, 72; 438/82, 99, 48, 149, 157
See application file for complete search history.

(56) References Cited

U.S. PATENT DOCUMENTS

2005/0200270 A1*    9/2005    Kwak et al. ................. 313/502

FOREIGN PATENT DOCUMENTS

| JP | 2001-005426 | 2/2001 |
|---|---|---|
| JP | 2001-076868 | 3/2001 |
| JP | 2001-222240 | 8/2001 |
| JP | 2002-006777 | 2/2002 |

* cited by examiner

*Primary Examiner*—Hsien-Ming Lee
(74) *Attorney, Agent, or Firm*—H.C. Park & Associates, PLC

(57) ABSTRACT

An electroluminescence (EL) display device can include a display area with pixels (each of which can include a first electrode layer and a second electrode layer on a substrate and electroluminescence units formed between the first and second electrode layers), an electrode power supply line supplying electrode power to the display area, one or more insulating layers disposed on the electrode power supply line (including one or more via holes and containing an organic material), and a sub-conductive layer formed on the insulating layer including the via hole along the electrode power supply line. In addition, the electrode power supply line and the second electrode layer may be coupled to each other at the via hole through the sub-conductive layer. The sub-conductive layer on the insulating layer can include one or more penetration portions.

15 Claims, 10 Drawing Sheets

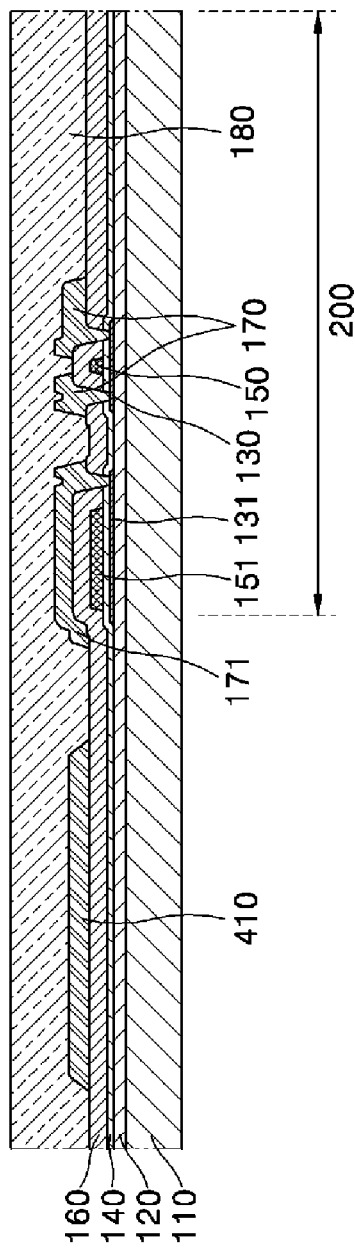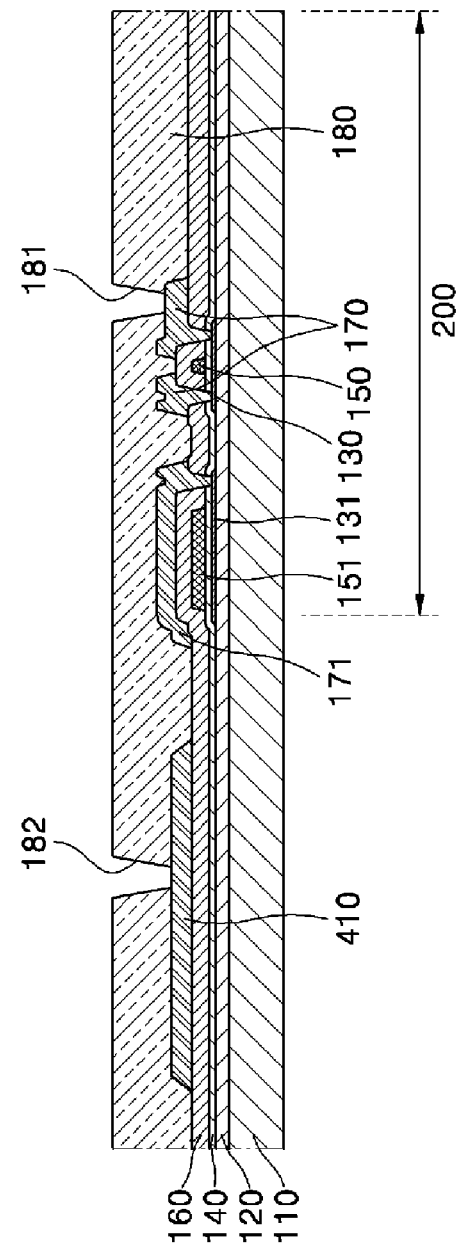

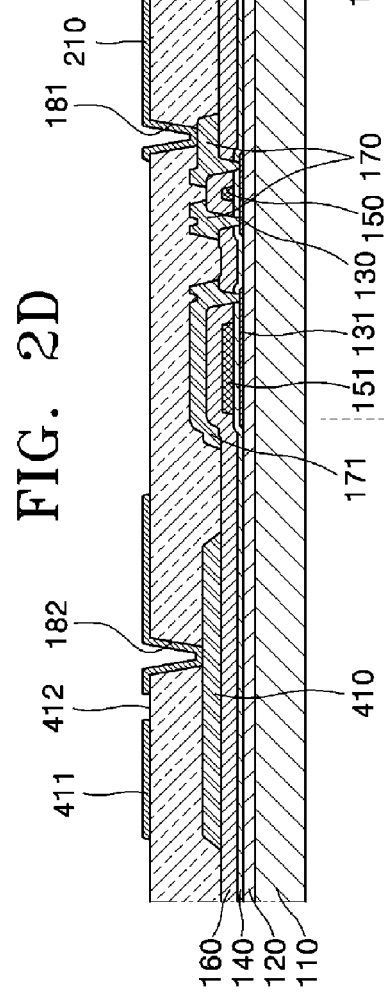
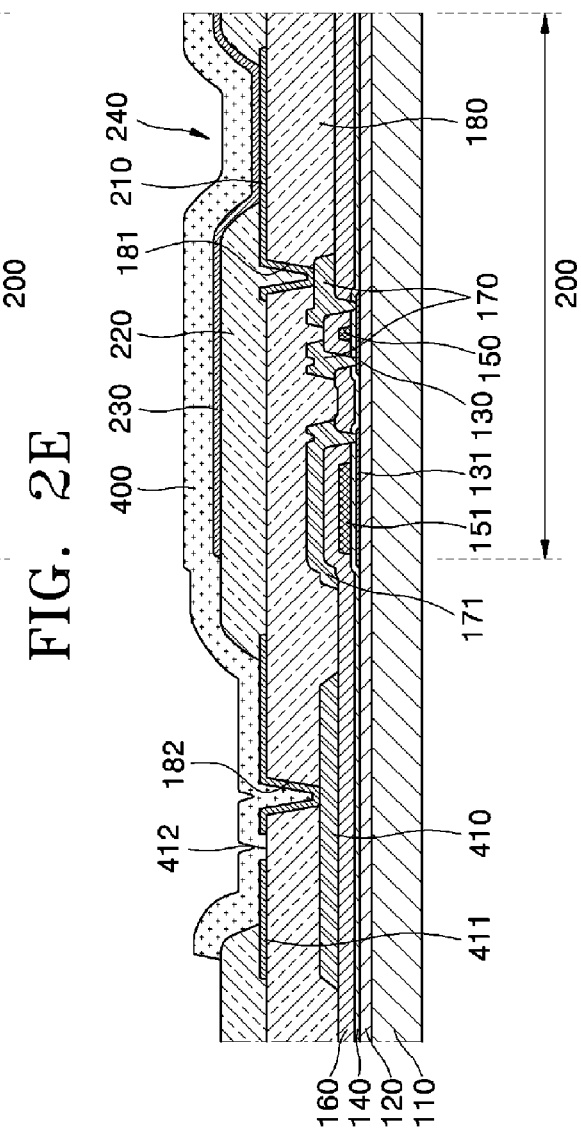

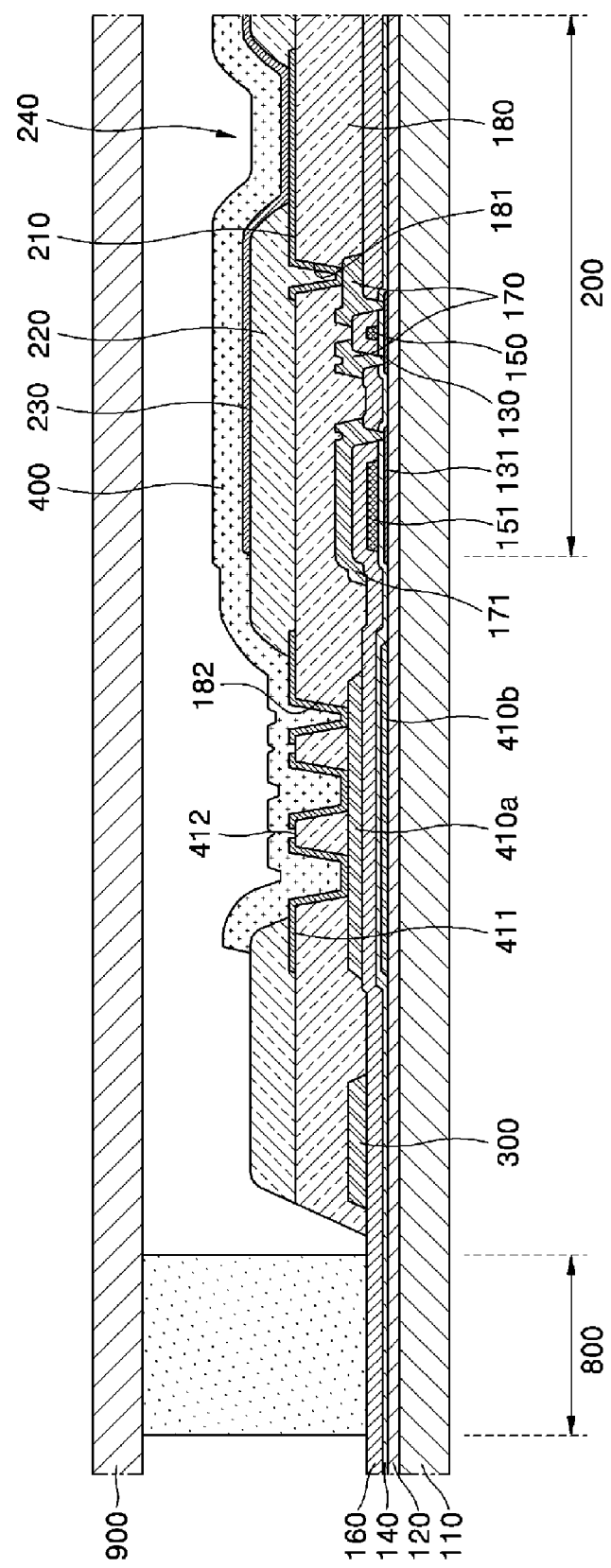

ELECTROLUMINESCENCE DISPLAY DEVICE AND METHOD OF MANUFACTURING THE SAME

BACKGROUND OF THE INVENTION

This application claims the priority of Korean Patent Application No. 10-2004-0038735, filed May 29, 2004, which is incorporated herein in its entirety by reference.

1. Field of the Invention

The present invention relates, for example, to a flat panel display. More particularly it relates, for example, to an organic or inorganic electroluminescence display device that can avoid peeling and other damage in the process of fabricating the electroluminescence device.

2. Description of the Related Art

Many kinds of display apparatuses are used to display images. Recently, various flat panel display devices have begun to substitute for cathode ray tubes (CRT). Flat panel display devices are either emissive or non-emissive. The emissive type display devices include, for example, a flat CRT, a plasma display panel (PDP), a vacuum fluorescent display, a field emission display (FED), and an inorganic or organic electroluminescent (EL) display. Non-emissive type display devices include, for example, liquid crystal displays (LCD). An organic EL device is, for example, an emissive device that does not require an additional light emitting unit such as a backlight. Thus, an organic EL device can operate with high efficiency and low power consumption and can emit blue light.

An organic EL device is an emissive display device in which electrons and holes injected through an anode and a cathode are recombined in an organic thin film to form excitons. Light of a certain wavelength is generated by the energy of the excitons. An organic EL device can be driven with low voltage, can be thin with light weight, can have a wide viewing angle, and can have a fast response speed.

An organic EL unit of an organic EL device includes a first electrode formed on a substrate (that can serve as an anode), an organic light emitting unit, and a second electrode (that can serve as a cathode). The organic light emitting unit includes an organic emitting layer (EML). Electrons and holes recombine in the organic EML to form excitons and generate light. In order to improve light emitting efficiency, the electrons and holes should be transported appropriately to the organic EML. Thus, an electron transport layer (ETL) can be disposed between the cathode and the organic EML and a hole transport layer (HTL) can be disposed between the anode and the organic EML. In addition, a hole injection layer (HIL) can be disposed between the anode and the HTL and an electron injection layer (EIL) can be disposed between the cathode and the ETL.

An organic EL device can be either a passive matrix (PM) type device or an active matrix (AM) type device, depending on how it is driven. In a PM type organic EL device, each anode and cathode pair is arranged in a column and row. A scan signal is, for example, supplied to the cathode from a row driving circuit, and one row is selected from among the rows. In addition, data signals are input into respective pixels in a column driving circuit. The AM type EL device controls the signal input into each pixel using a thin film transistor (TFT), and is suitable for processing enormous amounts of signals. Therefore, the AM type organic EL device is widely used as a display for realizing moving pictures.

As resolution of images displayed on the display device increases and the display device becomes larger, there is a need to reduce power consumption and improve aspects of image quality such as brightness. One of the methods is to reduce resistances of various wires through which power is supplied to the display area. Examples of such wires include the driving power supply line and the electrode power supply line.

Japanese Laid-open Patent No. 2001-109395 discloses an organic EL device, having an electrode that is electrically contacted to a cathode through a wide contacting portion between a terminal and a cathode and is formed of the same oxide material as an anode. The contact resistance that is caused by directly contacting the cathode to the terminal can be reduced, and the image quality can be improved.

However, according to the above conventional art, most of an insulating layer on an upper portion of the terminal is removed and the terminal is excessively exposed. Thus, the layer constituting the terminal may be peeled or damaged seriously in a subsequent process. In addition, an over coat layer that is made of an acryl-based resin is disposed on a lower portion of the electrode formed of the same oxide material as the anode, and the discharge path of gas generated from the over coat layer is blocked or lengthened by the electrode. Thus, the gas cannot discharge well, defects may occur, and time for processing may increase.

SUMMARY OF THE INVENTION

The present invention provides, for example, an electroluminescence (EL) display with a structure for preventing an electrode power supply line from being damaged and/or peeled. The structure may also help to sufficiently discharge gas generated from an insulating layer including an organic material layer. The present invention also provides, for example, a method of manufacturing such an EL display.

The present invention provides, for example, an EL display device that can include a display area with pixels. Each pixel can include a first electrode layer (this layer can include one or more layers) and a second electrode layer on a substrate. Electroluminescence units can be formed between the first and second electrode layers. An electrode power supply line can supply electrode power to the display area. One or more insulating layers can be disposed on the electrode power supply line and can include one or more via holes. The insulating layer can include an organic material.

A sub-conductive layer can be formed on the insulating layer (including the via hole) along the electrode power supply line. The electrode power supply line and the second electrode layer can be coupled to each other at the via hole through the sub-conductive layer. The sub-conductive layer on the insulating layer can include one or more penetration portions.

The present invention may also provide an electroluminescence display device including a display area including pixels (each of which may include a first electrode layer and a second electrode layer on a substrate), and electroluminescence units formed between the first and second electrode layers. It may also include an electrode power supply line supplying electrode power to the display area, an insulating layer disposed on the electrode power supply line (including a via hole and having an organic material included), and a sub-conductive layer including one or more unit sub-conductive layers formed on the insulating layer along the electrode power supply line. The electrode power supply line and the second electrode layer are coupled to each other at the via hole through the sub-conductive layer. The unit sub-conductive layers on the insulating layer are separated from each other.

The present invention also provides, for example, a method of manufacturing an electroluminescence display device. The display device may include a display area including pixels (each of which includes a first electrode layer and a second electrode layer on a substrate) and electroluminescence units formed between the first and second electrode layers. The device may also include an electrode power supply line supplying electrode power to the display area. The method may include the following: forming an insulating layer including an organic material on the electrode power supply line; forming a via hole on the insulating layer; forming a sub-conductive layer on the insulating layer; and forming a penetration portion on the sub-conductive layer.

The present invention additionally provides, for example, another method of manufacturing an electroluminescence display device. In the display device, a display area may include pixels (each of which includes a first electrode layer and a second electrode layer on a substrate), electroluminescence units formed between the first and second electrode layers, and an electrode power supply line supplying electrode power to the display area. The method may include the following: forming an insulating layer (including an organic material) on the electrode power supply line; forming a via hole on the insulating layer; and forming a sub-conductive layer including a plurality of unit sub-conductive layers on the insulating layer.

BRIEF DESCRIPTION OF THE DRAWINGS

FIGS. 2B, 2C, 2D, and 2E are cross-sectional views showing processes of manufacturing the organic EL display shown in FIG. 2A.

FIG. 5 is a partial cross-sectional view showing an organic EL of still another embodiment of the present invention.

DETAILED DESCRIPTION OF THE INVENTION

Figure 1:
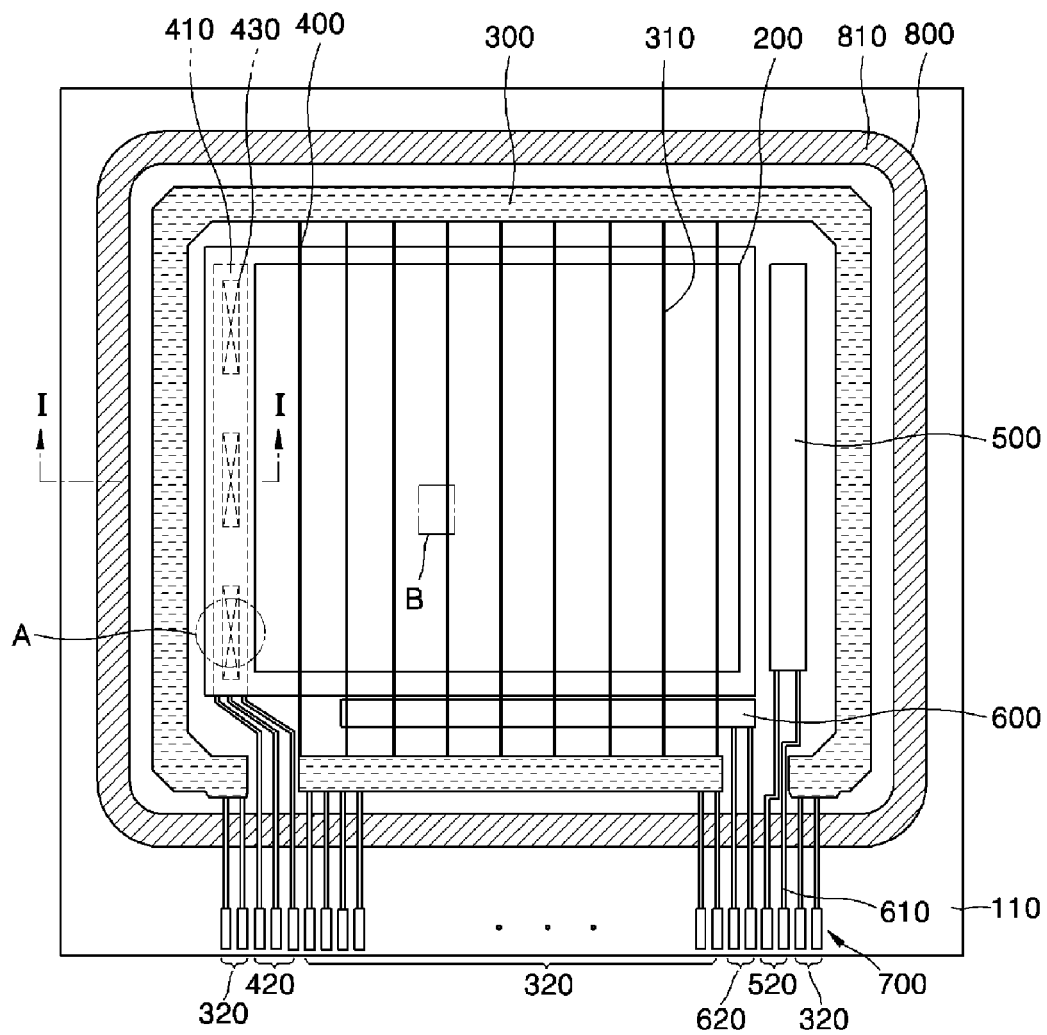
FIG. 1 is a plan view showing an organic electroluminescence (EL) display of the present invention.

The present invention will now be described in detail with reference to the accompanying drawings in which example embodiments of the invention are shown. The invention may, however, be embodied in different forms and should not be construed as limited to the embodiments shown and described. The dimensions in the drawings are exaggerated for clarity. The same reference numerals are used to denote the same elements throughout the specification.

FIG. 1 is a plan view showing an example organic electroluminescence (EL) device of the present invention. On a surface of a substrate 110, a display area 200 (from which a light emitting device such as an organic EL device can display), a sealing portion 800 applied along an outer portion of the display area 200 to seal the substrate 110 with a sealing substrate 900 (refer to FIG. 2A), and a terminal area 700 (on which various terminals may be disposed), can be formed. The substrate 110 and sealing substrate 900 are sealed through a sealant 810 of the sealing portion 800. The display area 200 can be sealed using a thin film sealing layer without the sealing portion 800.

A structure of the organic EL device forming the display area 200 will be described with reference to FIG. 2A, which is a cross-sectional view taken along line I-I of FIG. 1. A buffer layer 120 of $SiO_2$ may be formed on the substrate 110 (which may be, for example, a glass substrate). A semiconductor active layer 130 may be formed on the buffer layer 120, and the semiconductor active layer 130 can be formed, for example, as an amorphous silicon layer or a polycrystalline silicon layer.

Although it is not shown in the drawing in detail, the semiconductor active layer 130 can include source and drain regions that are doped by N+ type or P+ type dopant, as well as a channel region. However, the semiconductor active layer 130 is not limited to the above description. For example, the semiconductor active layer 130 can be formed of an organic semiconductor.

A gate electrode 150 may be formed on a portion of the semiconductor active layer 130 that corresponds to the channel region. The conduction state of the channel region can be determined by the signal applied to the channel region. The source and drain regions may be placed in communication with each other through the selection of the gate electrode 150. It may be desirable that the gate electrode 150 be formed of a material (for example, MoW and Al/Cu). The following are some considerations for material selection for the gate electrode 150: its adhesiveness with neighboring layers, its surface evenness, and its ability to be fabricated.

In order to ensure the insulation between the semiconductor active layer 130 and the gate electrode 150, a gate insulating layer 140 formed of $SiO_2$ may be disposed between the semiconductor active layer 130 and the gate electrode 150. The gate insulating layer 140 may be deposited by plasma enhanced chemical vapor deposition (PECVD).

An interlayer 160 may be formed on the gate electrode 150. The interlayer 160 can be formed as a single layer or a dual-layered structure using $SiO_2$ or SiNx. A source/drain electrode 170 (it may serve as either the source electrode or the drain electrode) may be formed on the interlayer 160. The source/drain electrode 170 may be coupled to the source region or the drain region of the semiconductor active layer 130 respectively through a contact hole formed on the interlayer 160 and the gate insulating layer 140.

One or more insulating layers (a passivation layer and/or an over coat layer) may be formed on the source/drain electrode 170 to protect and/or planarize the thin film transistor (TFT) on a lower portion thereof. The insulating layer 180 can include an organic insulating layer with an organic material such as benzocyclobutene (BCB) or acryl. The insulating layer 180 may be formed as a single layer and/or multiple-layer. In addition, the insulating layer 180 may includes an inorganic layer formed of an inorganic material such as $SiO_2$ or SiNx.

A first electrode layer 210 may be formed on a surface of the insulating layer 180. One end of the first electrode layer 210 may contact the drain electrode 170 through a via hole 181 that is formed on the insulating layer 180. The first electrode layer 210 can be formed of a transparent electrode such as indium tin oxide (ITO) for a rear surface emitting type. For a device that is a front surface emitting type, the first electrode layer 210 may be formed as a transparent electrode with a material such as ITO, and can include a reflective layer formed of Al, AlNd, or MgAg.

An organic EL unit 230 can be formed as a low molecular weight or polymer organic layer. If the organic EL unit 230 uses the low molecular weight organic layer, the organic EL unit 230 may include one or more of the following layers: a hole injection layer (HIL), hole transport layer (HTL), emission layer (EML), electron transport layer (ETL), or electron injection layer (EIL). In addition, the organic layer can be made of copper phthalocyanine (CuPc), N,N-di (naphthalene-1-yl)-N,N'-diphenyl-bezidine (NPB), or tris-8-hydroxyquinoline aluminum (Alq3). The lower molecular weight organic layer may be formed by vapor deposition.

If the organic EL unit 230 uses a polymer organic layer, it can include an HTL and an EML. PEDOT can be used as the HTL, and poly-phenylenevinylene (PPV)-based or poly-fluorene-based molecular organic material can be used as the EML. The layers can be formed by screen printing or inkjet printing.

A second electrode layer 400 may be deposited on entire upper surface of the organic EL unit 230 as a cathode. The second electrode layer 400 may be deposited in any suitable manner and can be formed of a material such as Al/Ca, ITO, Mg—Ag depending on the light emitting type of the display (whether top, bottom, or dual emitting). In addition, it can be formed as multiple layers and can further include alkaline fluoride (such as LiF) or alkaline earth metal fluoride. The first electrode layer 210 is described as the anode, and the second electrode layer 400 is described as the cathode for convenience sake in this application, but the functions could be readily inverted.

As shown in FIG. 1, a driving power supply line 300 may be disposed on the outer portion of the display area 200 for supplying the driving power to the display area 200. The driving power supply line 300 may be coupled to a driving power supplying terminal 320 of the terminal area 700. The arrangement of the driving power supply line is not limited to the example shown in FIG. 1.

It may be desirable that the driving power supply line 300 be formed to surround the display area 200 in order to improve the uniformity of brightness by supplying the driving power evenly to the entire display area. The driving power supply line 300 may be connected to a driving line 310, and the driving line 310 may be arranged to cross the display area 200 and may be coupled to the source electrode 170 (refer to FIG. 2B) that is disposed under the insulating layer 180.

In addition, vertical and horizontal driving circuit units 500 and 600 may be disposed on the outer portion of the display area 200, and the vertical/horizontal driving circuit units 500 and 600 may be coupled to respective vertical and horizontal driving terminals 520 and 620 of the terminal area 700. The vertical driving circuit unit 500 can be a scan driving circuit unit that applies scan signals to the display area 200, and the horizontal driving circuit unit 600 can be a data driving circuit unit that applies data signals to the display area 200. In addition, these can be realized as an outer integrated circuit (IC) or a chip on glass (COG).

As shown in FIG. 1, an electrode power supply line 410 that supplies electrode power to the display area 200 may be disposed along a part of the outer portion of the display area 200. The electrode power supply line 410 may be coupled to an electrode power supply terminal 420 of the terminal area 700.

Figure 2A:
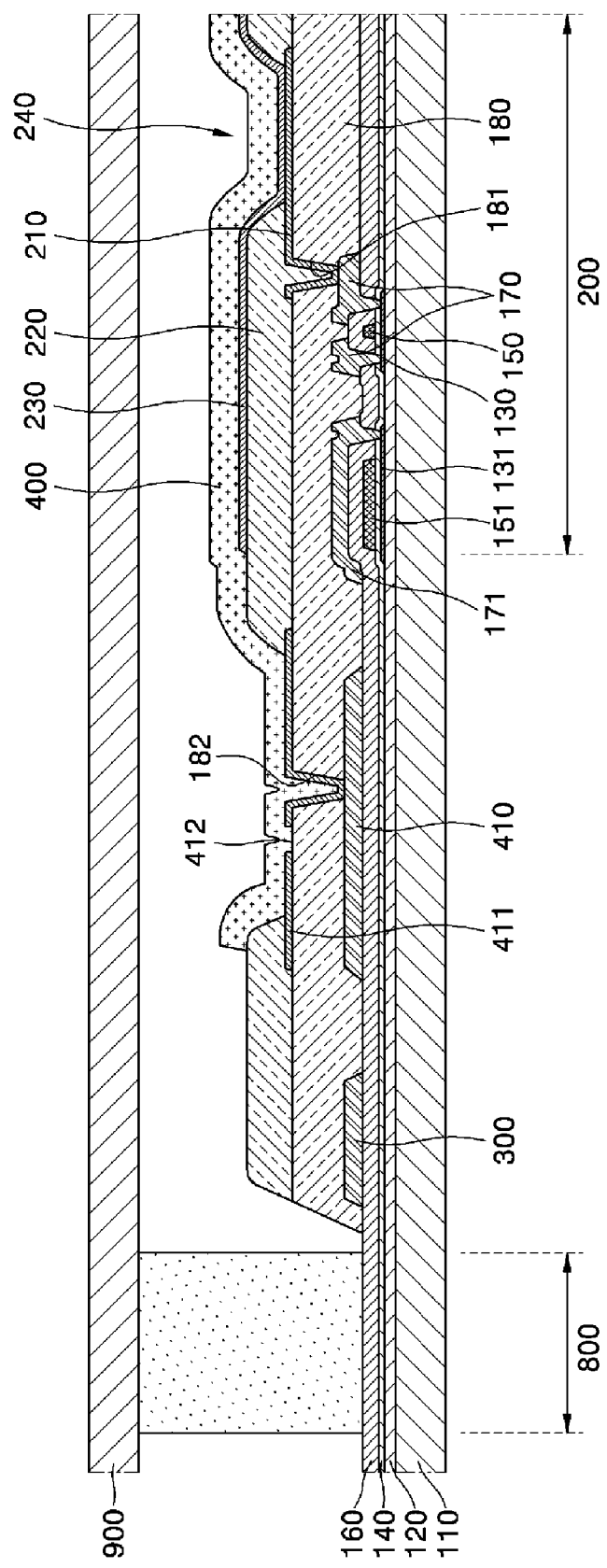
FIG. 2A is a partial cross-sectional view taken along line I-I of FIG. 1.

FIG. 2A is a partial cross-sectional view showing the organic EL device taken along line I-I of FIG. 1. In FIG. 2A, one or more insulating layers 180 may extend on the upper portion of the electrode power supply line 410 disposed on the outer portion of the display area 200. A sub-conductive layer 411 may be further formed on the extended insulating layer 180.

FIGS. 2B, 2C, 2D, and 2E are cross-sectional views showing processes of manufacturing the organic EL device of the present invention. As shown in FIG. 2B, the electrode power supply line 410 can be formed simultaneously with the source/drain electrode 170 of the TFT. After the electrode power supply line 410 is formed, one or more insulating layers 180 including an organic layer may be formed on the electrode power supply line 410.

As shown in FIG. 2C, a via hole 182 for electrically connecting to the electrode power supply line 410 may be formed. The via hole 182 for the electrode power supply line 410 can be formed simultaneously with the via hole 181 for electrically connecting the first electrode layer 210 (refer to FIG. 2D) (which may be the pixel electrode) to the source/drain electrode 170.

As shown in FIG. 2D, after forming the via hole 182, the sub-conductive layer 411 may be formed on the surface of the insulating layer 180 including the via hole 182. The coupling between the second electrode layer 400 and the electrode power supply line 410 may be performed by the sub-conductive layer 411 that is disposed between them.

Since the insulating layer 180 extends between the electrode power supply line 410 and the sub-conductive layer 411 (except for the via hole 182), peeling of the electrode power supply line 410 can be prevented. The peeling can occur when the insulating layer 180 is not disposed between the electrode power supply line 410 and the sub-conductive layer 411. In addition, the sub-conductive layer 411 can prevent the exposed electrode power supply line 410 from being damaged during the formation of a pixel defining layer (220, refer to FIG. 2E) and an organic EL unit 230 on the display area.

The sub-conductive layer 411 can be formed simultaneously with the first electrode layer 210. For example, if the organic EL device is a front surface emitting type including the reflective layer with a reflective material such as Al, AlNd, and MgAg, the sub-conductive layer 411 can include the transparent conductive layer such as ITO layer and/or the reflective layer AlNd. If the first electrode layer 210 is formed by depositing the material for the first electrode layer 210 on the insulating layer 180 including the via holes 181 and 182 and patterning the material, a portion of the material corresponding to the sub-conductive layer 411 can be patterned at the same time to form the sub-conductive layer 411.

One or more penetration portions 412 may be formed on the sub-conductive layer 411 that is on the insulating layer 180. As shown in FIG. 2D, after forming the penetration portion 412 on the sub-conductive layer 411, the stacked portions on the substrate undergo an annealing process under a vacuum environment for a predetermined period. This annealing can serve to discharge the gas such as benzaldeyde, benzyl alcohol, benzene-based compounds that can be generated from the insulating layer 180 containing an organic layer. Thus, the insulation can be saved from being damaged by the gas.

As described above, since the gas can discharge through the penetration portion 412 located inside the sub-conductive layer 411, the discharging path of the gas generated from the insulating layer can be made shorter than the path through the outer portion of the sub-conductive layer 411. Thus, the processing time of the vacuum annealing process can be significantly reduced.

After that, as shown in FIG. 2E, a pixel defining layer 220 (for defining the pixels on the display area 200) can be formed on the substrate (except for at least a portion of a pixel opening portion 240 of the first electrode layer 210 and of the sub-conductive layer 411). The pixel defining layer can be formed by a spin coating process and a patterning process.

The stacked portion of the substrate 110 including the pixel defining layer 220 may be annealed in the vacuum environment to discharge the gas that can be generated from the pixel defining layer 220. Then, the organic EL unit 230 and the second electrode layer 400 may be sequentially formed on the portion including the pixel opening portion 240.

Figure 3A:
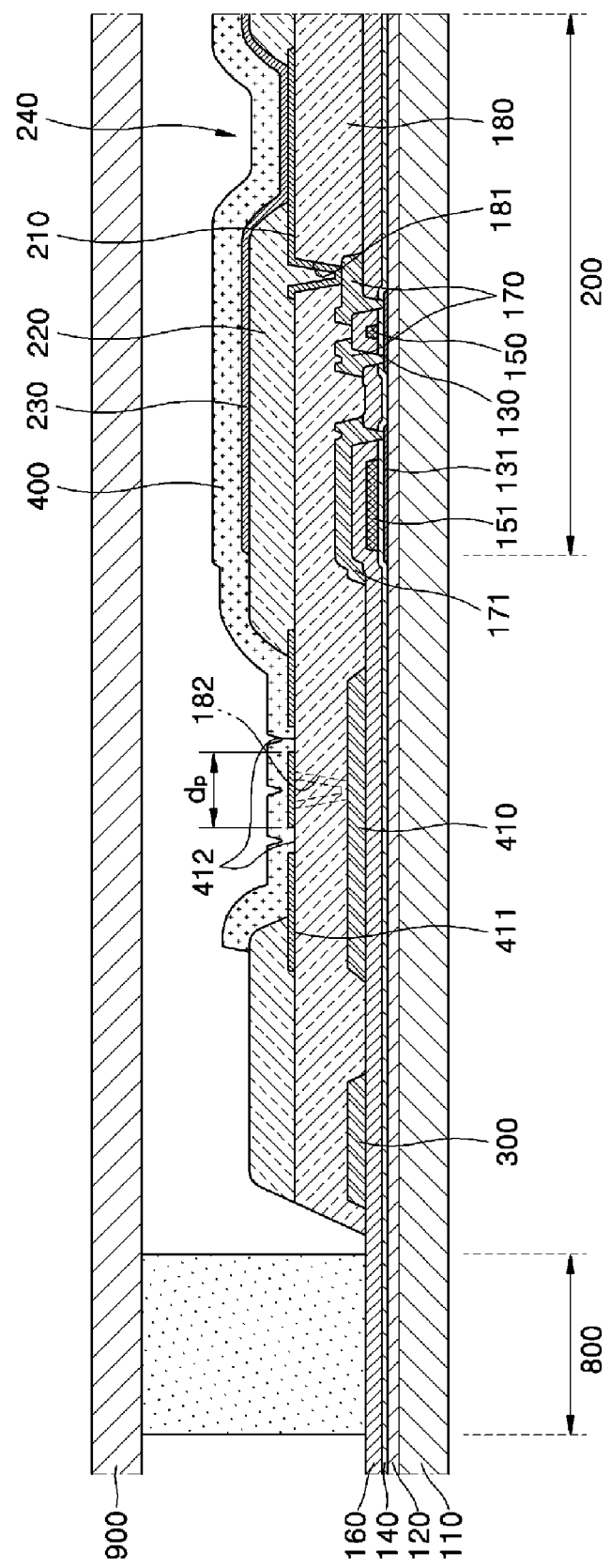
FIG. 3A is a partial cross-sectional view showing an organic EL of another embodiment of the present invention.

In FIG. 2A, one penetration portion 412 may be formed on the sub-conductive layer 411 corresponding to the insulating layer 180. However, two or more penetration portions 412 can be disposed on the sub-conductive layer 411 as shown in FIG. 3A. The via hole 182 denoted by a dotted line refers to the via hole 182 disposed on the rear portion. Since the penetration portions 412 have a particular size (through which the gas generated from the insulating layer 180 can discharge smoothly in the vacuum annealing process), it is desirable that a distance (dp) between the penetration holes 412 formed on the sub-conductive layer 411 be less than or equal to the maximum distance between two ends of the first electrode layer (210, refer to FIG. 6B).

Figure 3B:
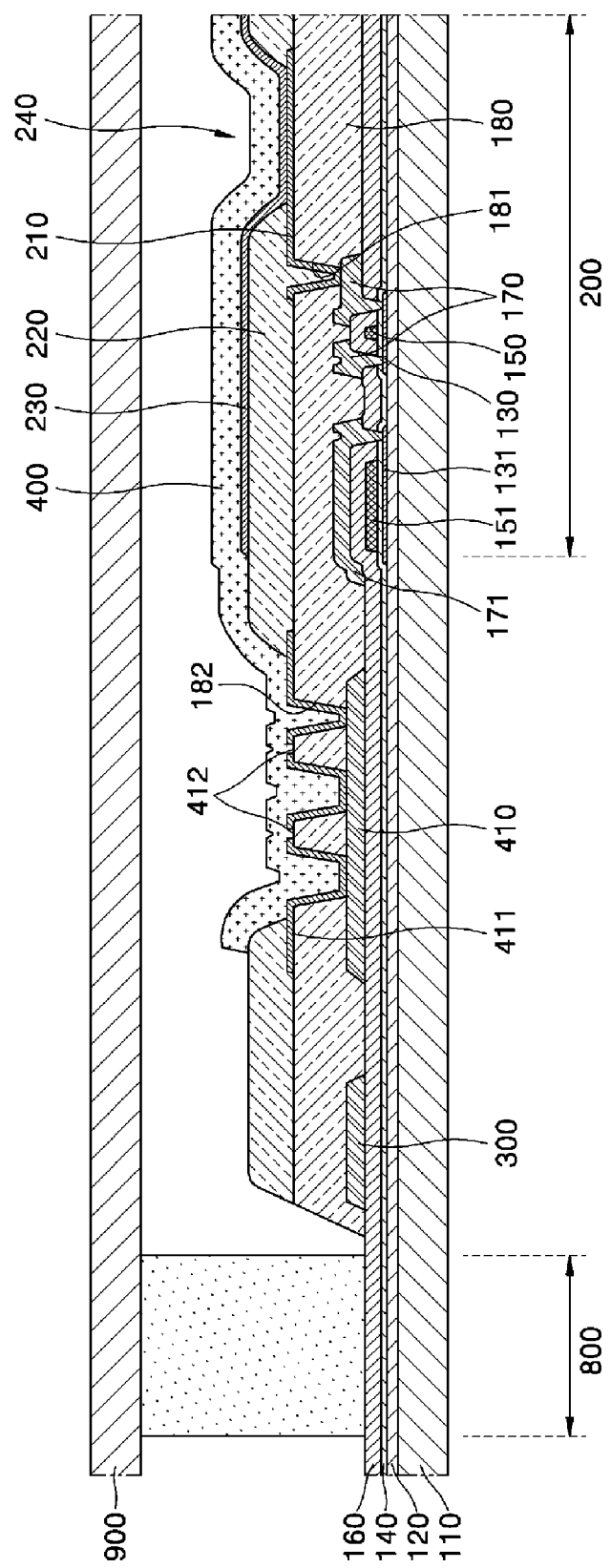
FIG. 3B is a partial cross-sectional view showing an organic EL of still another embodiment of the present invention.

It is desirable that the via hole of the insulating layer includes one or more penetration portions at least on the outer portion thereof. As shown in FIG. 3B, when two or more via holes 182 are formed on the insulating layer 180 on the electrode power supply line 410, a part of the insulating layer 180 can be surrounded by the sub-conductive layer 411. It may be desirable that one or more penetration portions 412 be disposed on the outer portion of the via hole 182 so that the gas generated from the surrounded portion of the insulating layer 180 can discharge smoothly.

Figure 4A:
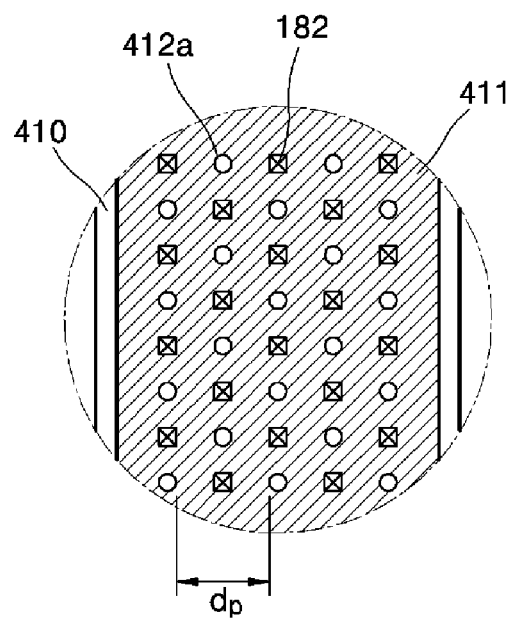
FIGS. 4A and 4B are partial expanded views showing a sub-conductive layer of various shapes of the present invention.
Figure 4B:
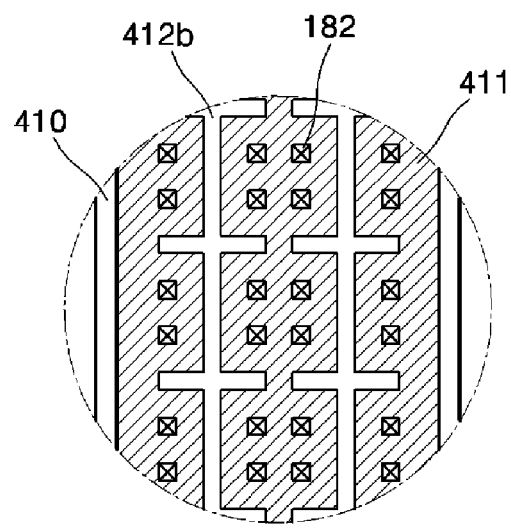

The penetration portion formed on the sub-conductive layer 411 can be formed in is various shapes. FIGS. 4A and 4B are expanded views of part "A" of FIG. 1 (the insulating layer is not shown). As shown in FIG. 4A, penetration holes 412a (which can serve as the penetration portions) can be formed on the sub-conductive layer 411. As shown in FIG. 4B, line type penetration portions 412b including a few straight lines can be formed if necessary to provide sufficient gas discharge. It may be desirable that one or more penetration portions 412a or 412b be formed on at least the outer portion of the via hole 182. The distance between the penetration portions 412a or 412b may be the less than or equal to the maximum distance between both ends of the first electrode layer.

In the examples shown in FIGS. 2B, 2C, 2D, 2E, 3A and 3B, the same layer may be used as both the source/drain electrode 170 and the electrode power supply line 410. However, this dual use single layer is not required. As shown in FIG. 5, in order to ensure sufficient conductivity in the electrode power supply line 410, it can include a layer 410b that is the same as the semiconductor active layer 130, and the layer 410a that is the same as the source/drain electrode 170. Otherwise, the electrode power supply line 410 can include a layer 412b that is the same as the semiconductor active layer 130.

Figure 6A:
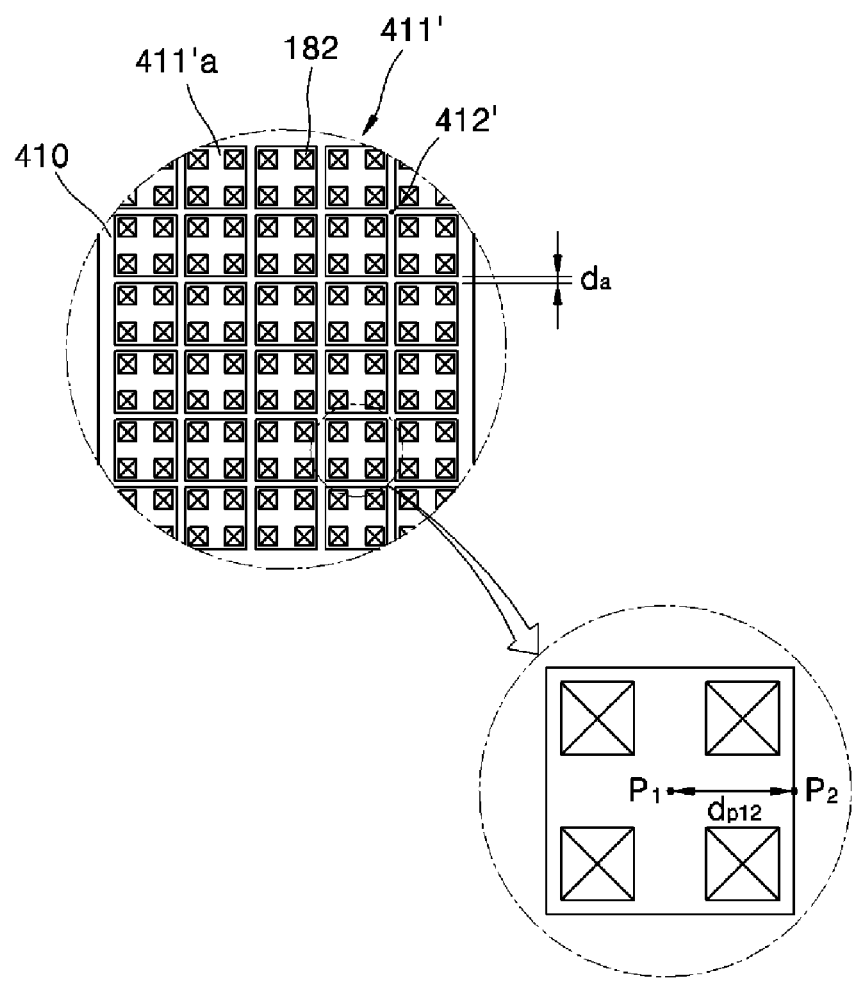
FIG. 6A is a partial expanded view showing a sub-conductive layer of the present invention.

The sub-conductive layer 411 can be formed as one or more unit sub-conductive layers that are separated from each other. FIG. 6A is an expanded view showing part "A" of FIG. 1. The sub-conductive layer 411' can include one or more unit sub-conductive layers 411'a that are formed on the insulating layer 180 including the via hole 182. The sub-conductive layer 411' including the unit sub-conductive layers 411'a can be formed simultaneously with the first electrode layer 210 in the patterning process of the first electrode layer 210. The unit sub-conductive layers 411'a may be separated a predetermined distance $d_a$ from each other. Thereby they may more quickly discharge the gas generated from the insulating layer 180 in the vacuum annealing process.

Figure 6B:
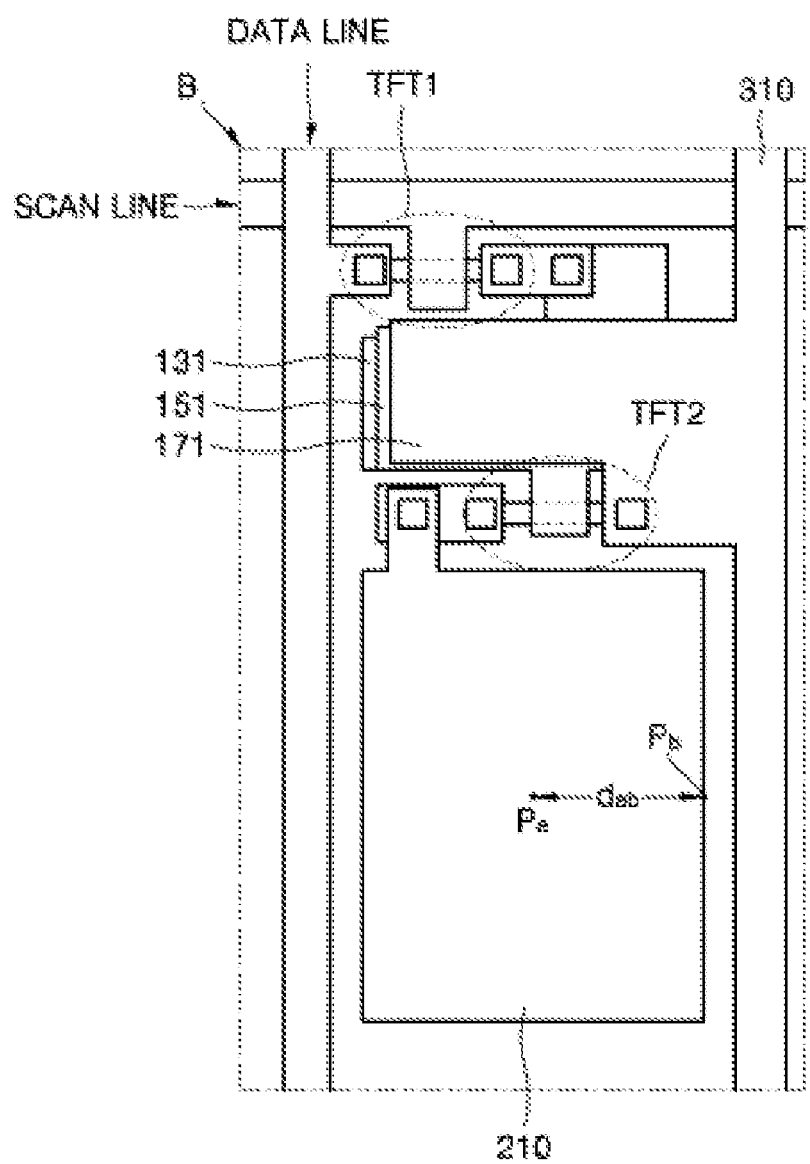
FIG. 6B is a partial cross-sectional view showing an expanded portion of "B" in FIG. 1.

It may be desirable that the unit sub-conductive layer 411'a have a minimum size of a predetermined value to ensure that the gas discharge from the insulating layer 180 can be performed quickly enough. FIG. 6B is a schematic view showing a pixel on the display area 200, denoted by reference numeral "B" in FIG. 1. A first TFT (TFT1) may be the TFT that selects the pixel depending on the signal from the scan line, and a second TFT (TFT2) may be the TFT that supplies electric current to the first electrode layer 210 to drive the pixel according to electric signals from capacitor 131, 151, and 171. Here, two top-gate type TFTs and a multi-layered capacitor are used in the example shown in FIG. 6B, but the present invention is not limited to this configuration.

It may be desirable that the distance ($d_{p12}$) between a point $P_1$ of the unit sub-conductive layer 411'a and a neighboring outer point $P_2$ be less than or equal to the maximum distance ($d_{ab}$) between a point Pa of the first electrode layer 210 and a neighboring outer point Pb. This situation may allow the gas generated from the insulating layer under the first electrode layer 210 to discharge sufficiently in the vacuum annealing process.

The above described embodiments are merely examples of the present invention, and the present invention is not limited to these embodiments. It can be modified in various respects if it includes the penetration portions formed on the sub-conductive layer that is disposed on the insulating layer including the via hole. In addition, the above embodiments describe with respect to organic EL devices, but the present invention can be applied to an inorganic EL device similarly.

According to the present invention, the insulating layer may be disposed between the electrode power supply line and the second electrode layer to prevent the electrode power supply line from peeling, and the sub-conductive layer may be formed between the electrode power supply line and the second electrode layer and may include penetration portions to prevent the electrode power supply line from being damaged and peeled. In addition, the gas generated from the organic insulating layer during a subsequent vacuum annealing process can discharge expediently, thereby reducing processing time and costs for manufacturing the device.

In addition, the penetration portion of the sub-conductive layer may be disposed on at least a part of the outer portion of the via hole and/or the distance between the penetration portions may be maintained constantly. Therefore, the gas generated from the insulating layer under the sub-conductive layer may not be captured by the sub-conductive layer, and can discharge rapidly and expediently.

The sub-conductive layer can include the unit sub-conductive layers that are separated from each other and smaller than the first electrode layer. Thus gas generated from the insulating layer can discharge rapidly. In addition, the electrode power supply line of the present invention can include one or more conductive layers to ensure the sufficient conductivity.

Although the invention has been particularly described with reference to certain embodiments thereof, changes may be made to these embodiments without departing from the scope of the invention.

What is claimed is:

1. An electroluminescence display device, comprising:
    a display area with pixels that have a first electrode layer and a second electrode layer on a substrate and an electroluminescence unit formed between the first electrode layer and the second electrode layer;
    an electrode power supply line to supply electrode power to the display area;
    an insulating layer disposed on the electrode power supply line, including a via hole and containing an organic material; and
    a sub-conductive layer formed on the insulating layer including the via hole along the electrode power supply line,
    wherein the electrode power supply line and the second electrode layer are coupled to each other at the via hole through the sub-conductive layer, and the sub-conductive layer on the insulating layer includes a penetration portion.

2. The device of claim 1, wherein the sub-conductive layer comprises the same layer as at least a part of the first electrode layer.

3. The device of claim 1, wherein the sub-conductive layer comprises two penetration portions, and a distance between the two penetration portions is less than or equal to a maximum distance between both ends of the first electrode layer.

4. The device of claim 3, wherein at least one of the two penetration portions is disposed on at least a part of an outer portion of the via hole.

5. The device of claim 1, wherein the penetration portion comprises a penetration hole.

6. The device of claim 1, wherein the penetration portion comprises a line type penetration portion.

7. The device of claim 1, wherein a thin film transistor layer is disposed under the first electrode layer, and the electrode power supply line comprises a layer that is the same layer as a source/drain electrode of the thin film transistor layer.

8. The device of claim 1, wherein a thin film transistor layer is disposed under the first electrode layer, and the electrode power supply line comprises a layer that is the same layer as a semiconductor active layer of the thin film transistor layer.

9. An electroluminescence display device, comprising:
    a display area with pixels that have a first electrode layer and a second electrode layer and an electroluminescence unit formed between the first electrode layer and the second electrode layer;
    an electrode power supply line to supply electrode power to the display area;
    an insulating layer disposed on the electrode power supply line, including a via hole and containing an organic material; and
    a sub-conductive layer comprising a plurality of unit sub-conductive layers formed on the insulating layer including the via hole along the electrode power supply line,
    wherein the electrode power supply line and the second electrode layer are coupled to each other at the via hole through the sub-conductive layer, and the unit sub-conductive layers on the insulating layer are separated from each other.

10. The device of claim 9, wherein a distance between a point of the unit sub-conductive layer and a neighboring outer point is less than or equal to a maximum distance between a point of the first electrode layer and a neighboring outer point.

11. A method of manufacturing an electroluminescence display device, comprising:
    forming an insulating layer including an organic material on an electrode power supply line;
    forming a via hole on the insulating layer;
    forming a sub-conductive layer and a first electrode layer on the insulating layer including the via hole;
    forming a penetration portion on the sub-conductive layer;
    forming an organic EL unit on the first electrode layer; and
    forming a second electrode layer on the organic EL unit.

12. The method of claim 11, wherein forming of the sub-conductive layer is simultaneous with forming the first electrode layer.

13. The method of claim 11, wherein two or more via holes are formed when the via hole is formed, and the penetration portion is formed between the via holes when the penetration portion is formed.

14. The method of claim 11, wherein forming the penetration portion comprises forming two or more penetration portions, and a distance between the penetration portions is less than or equal to a maximum distance between two ends of the first electrode layer.

15. A method of manufacturing an electroluminescence display device, comprising:
    forming an insulating layer including an organic material on an electrode power supply line;
    forming a via hole on the insulating layer;
    forming a sub-conductive layer comprising a plurality of unit sub-conductive layers and a first electrode layer on the insulating layer;
    forming an organic EL unit on the first electrode layer; and
    forming a second electrode layer on the organic EL unit.

* * * * *